(12) United States Patent
Wu et al.

(10) Patent No.: US 11,894,084 B2
(45) Date of Patent: Feb. 6, 2024

(54) SELECTIVE MARGIN TESTING TO DETERMINE WHETHER TO SIGNAL TRAIN A MEMORY SYSTEM

(71) Applicant: Intel Corporation, Santa Clara, CA (US)

(72) Inventors: Dujian Wu, Shanghai (CN); Shijian Ge, Shanghai (CN); Daocheng Bu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 228 days.

(21) Appl. No.: 17/421,483

(22) PCT Filed: Feb. 8, 2019

(86) PCT No.: PCT/CN2019/074738
§ 371 (c)(1),
(2) Date: Jul. 8, 2021

(87) PCT Pub. No.: WO2020/160691
PCT Pub. Date: Aug. 13, 2020

(65) Prior Publication Data
US 2022/0093197 A1    Mar. 24, 2022

(51) Int. Cl.
| | | |
|---|---|---|
| *G11C 29/10* | (2006.01) | |
| *G11C 29/02* | (2006.01) | |
| *G11C 29/38* | (2006.01) | |
| *G11C 29/46* | (2006.01) | |
| *G11C 29/12* | (2006.01) | |

(52) U.S. Cl.
CPC ........ *G11C 29/10* (2013.01); *G11C 29/12005* (2013.01); *G11C 29/12015* (2013.01); *G11C 29/38* (2013.01); *G11C 29/46* (2013.01)

(58) Field of Classification Search
None
See application file for complete search history.

(56) References Cited

U.S. PATENT DOCUMENTS

| | | | |
|---|---|---|---|
| 5,274,778 A | 12/1993 | Hall | |
| 2017/0090804 A1* | 3/2017 | Bialas, Jr. | ........... G11C 7/00 |
| 2017/0177258 A1* | 6/2017 | Bates | ............ G06F 3/0634 |
| 2018/0095806 A1 | 4/2018 | Aneja et al. | |

FOREIGN PATENT DOCUMENTS

JP    H08179009 A    7/1996

OTHER PUBLICATIONS

International Search Report and Written Opinion for International Patent Application No. PCT/CN2019/074738, dated Oct. 30, 2019, 9 pages.

* cited by examiner

*Primary Examiner* — Cynthia Britt
*Assistant Examiner* — Matthew W Wahlin
(74) *Attorney, Agent, or Firm* — Jordan IP Law, LLC

(57) ABSTRACT

Method, systems and apparatuses may provide for technology that executes a margin test of a first memory storage based on a subset of first signals associated with the first memory storage. The technology determines, based on the margin test, first margin data to indicate whether the first memory storage complies with one or more electrical constraints. The technology determines, based on the first margin data, whether to execute a signal training process.

24 Claims, 8 Drawing Sheets

US 11,894,084 B2

SELECTIVE MARGIN TESTING TO DETERMINE WHETHER TO SIGNAL TRAIN A MEMORY SYSTEM

CROSS REFERENCE TO RELATED APPLICATIONS

The present application is a U.S. National Phase Patent Application, which claims the benefit of priority to International Patent Application No. PCT/CN2019/074738 filed on Feb. 8, 2019.

TECHNICAL FIELD

Embodiments generally relate to memory management. More particularly, embodiments relate to accurate memory control and design.

BACKGROUND to Computing systems (e.g., servers, cellular devices, etc.) may be trained to effectively utilize memory modules (e.g., Dual-Inline-Memory-Modules which may be referred to as DIMMs). For example, the computing systems may undergo signal training to deliver a stable memory environment. Signal training may include identifying appropriate voltages, timings and/or electrical characteristics of control, command and data signals of a memory module to avoid memory losses and/or failures. The total latency of signal training is dependent on the number of memory modules (e.g., DIMMs) populated on system. That is, as the number of DIMMs increase, the time needed to perform signal training increases. Further, a computing system may perform the signal training during a boot process of the computing system to provide a stable operating system environment after the boot process. Thus, signal training is necessary under some circumstances for stability, but increases latency during the boot process.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
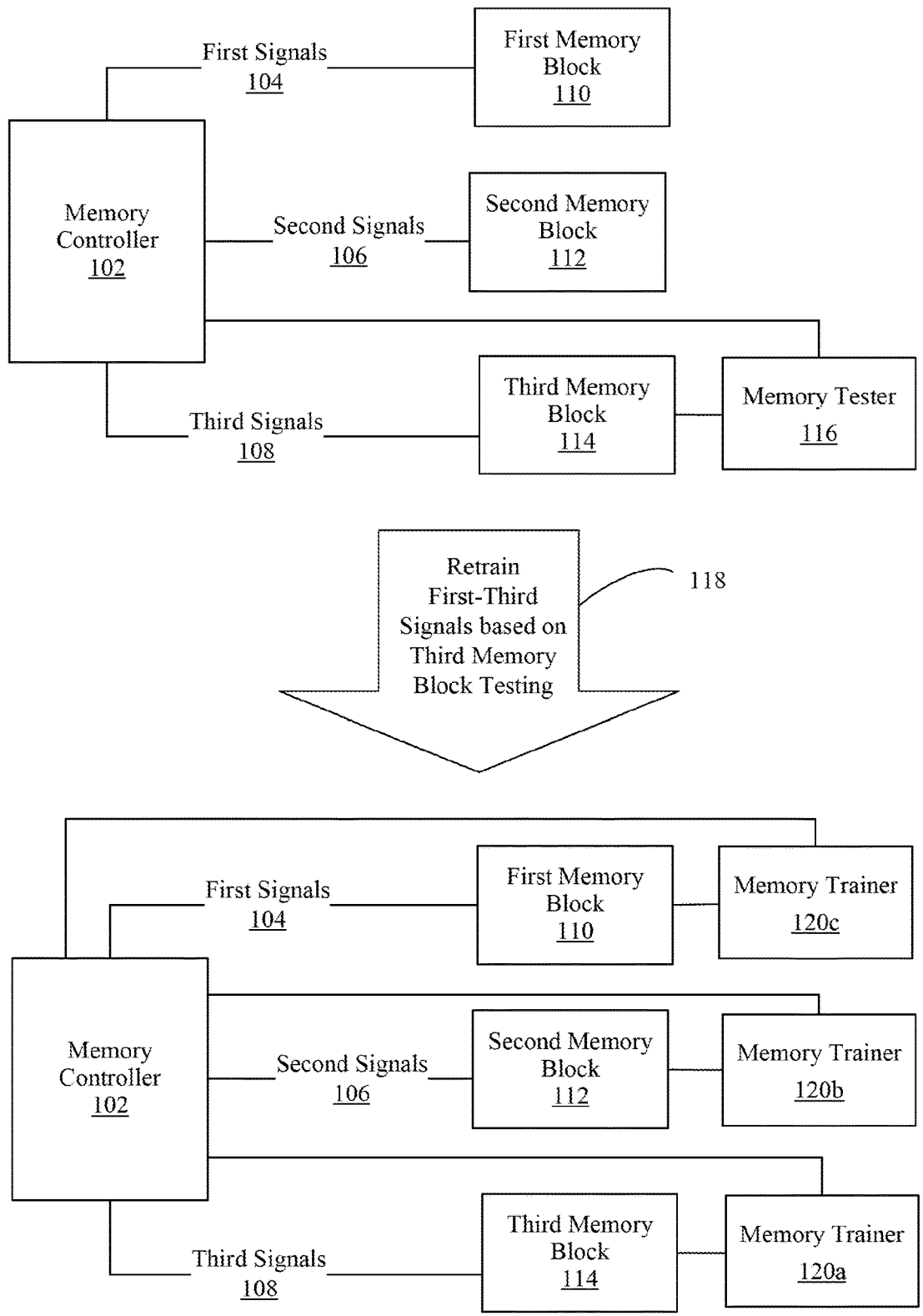
FIG. 1 illustrates an example of a process to retrain memory signals by testing a subset of memory blocks according to an embodiment.

FIG. 1 illustrates a process 100 to enhance memory reliability and usage in a power efficient and low latency manner. The process 100 may occur during a current boot process that includes a low latency "fast boot" mode. For example, a boot process firmware (e.g., Basic Input-Output System or Unified Extensible Firmware Interface) may cache previously identified signal values (e.g., timings and/or voltages) that were identified during a full signal training mode of a previous boot process. In the fast boot mode, boot process firmware may apply the identified signal values directly to a system without any signal training. For example, the memory controller 102 may control first memory block 110, second memory block 112 and third memory block 114 based on the identified signal values. The memory controller 102 may interact with the first, second and third memory blocks 110, 112, 114 using the first, second and third signals 104, 106, 108. The memory controller 102 may program data into (e.g., write) and/or retrieve data (e.g., read) from the first, second and third memory blocks 110, 112, 114 using the first, second and third signals 104, 106, 108. For example, the memory controller 102 may transmit the first, second and third signals 104, 106, 108 to program and send instructions to the first, second and third memory blocks 110, 112, 114. For example, the third signals 108 may include control, command and data signals. The memory controller 102 may be a processor, and the first, second and third memory blocks 110, 112, 114 may be memory storages for example.

An external environment may be changed between the previous and current boot processes. Such external environmental changes may result in changes to temperature, humidity or electronic noises, etc. For example, the memory controller 102, the first memory block 110, the second memory block 112 and the third memory block 114 may be part of a same computing system. The computing system may be shipped from a low latitudes area (e.g., warm area) to a high latitudes area (e.g., cold area). The change in the external environment may result in a shift of signal characteristics. In some cases, the computing system is unable to compensate for the shift through signal-compensation circuits, and the previously identified signal values may not be trustable (e.g., cause system instability).

Some embodiments may provide for a low latency boot process while enhancing system stability and safety. In detail, the boot process firmware may employ a memory tester 116 to test the third memory block 114 based on the third signals 108 (that are output and received during the testing) to diagnose memory signal margins and identify whether a signal retraining process is to be executed. The testing process latency is reduced by testing only a subset of the first, second and third memory blocks 110, 112, 114 based on a subset of the first, second and third signals 104, 106, 108. Reliability increases as well since the process 100 may accurately determine when to retain based on the results of the memory tester 116. Thus, due to the reduced latency of testing, the process 100 may execute during each boot process of the computing system that includes the first, second and third memory blocks 110, 112, 114 to enhance system reliability and performance.

For example, the memory tester 116 may execute margin testing to intentionally vary system parameters (e.g., modify voltage levels higher or lower to test for failures and/or misreads, modify temperatures, etc.) to expose the memory controller 102 and the third memory block 114 to conditions that reveal failure and pass conditions. In some embodiments, the results of the testing may include pass/fail levels, voltage level output (e.g., high or low) by the memory controller 102, voltage level read (e.g., high or low) by the third memory block 104, whether the third memory block 114 received the third signals 108 during an intended clock cycle and an intended voltage value, etc. The results of the margin testing may be stored as margin data indicating margin quality.

For example, the memory tester 116 may determine that the third memory block 114 is not receiving commands from the memory controller 102 through the third signals 108, and/or reading improper voltage levels to result in a potentially unsafe computing environment. For example, the memory controller 102 may output one signal of the third signals 108 to be at a high voltage, but the third memory block 114 may improperly read the one signal as a low. The memory tester 116 may identify that the third memory block 114 is reading a low voltage when the memory controller 102 actually outputs a high voltage, and thus the memory tester 116 determines that a test failure has occurred.

As another example, the memory tester 116 may identify the commands and data that the memory controller 102 transmits to the third memory block, and the memory tester 116 may read the third memory block 114 to determine whether the third memory block 114 receives the correct commands and data. For example, the memory tester 116 may read the third memory block 114 to determine whether the correct data is being stored and retrieved based on the third signals 108. In some embodiments, the memory tester 116 may compare the current boot process testing data to testing data generated during a last full signal training process. The last full signal training process may have occurred during the previous boot process. If the difference in the testing data of the current boot process and the testing data of the previous boot process is higher than a specific threshold, the first-third signals 104, 106, 108 may undergo a full signal training process.

Thus, the memory tester 116 may check margin quality of the third signals 108 at the timings identified by the previously identified signal values. If the memory tester 116 determines that the margin quality is unacceptable, another signal training process may be executed to modify the electrical and/or timing characteristics of the first, second and third signals 104, 106, 108. In some embodiments, the memory tester 116 may be part of the boot process firmware and include a Rank Margin Tool (RMT) to execute a margin test of third memory block 114 based on the third signals 108.

As illustrated, in some embodiments the memory tester 116 may only test the third memory block 114 based on a subset of the third signals 108. A change in margin quality based on the subset of third signals 108 may correlate to an overall change in margin quality of the first, second and third memory blocks 110, 112, 114. As such, it may be unnecessary to test each the first, second and third memory blocks 110, 112, 114 based on all of the first, second and third signals 104, 106, 108. By omitting some testing, latency is reduced since the memory tester 116 only tests the third memory block 114 based on a subset of the third signals 108. Further, only some, but not all, of the third signals 108 may be tested.

While the present example describes that the third memory block 114 is tested, it will be understood that various combinations of first, second and third signals, 104, 106, 108 and the first, second and third memory blocks 110, 112, 114 may be tested. For example, the memory tester 116 may test the first memory block 110 based on a subset of the first signals 104 in addition to or rather than testing the third memory block 114 based on the third signals 108.

Process 100 may retrain the first, second and third signals 104, 106, 108 based on the third memory block 114 testing 118 described above. That is, in the present example, the memory tester 116 determines that the testing of the third memory block 114 has failed so that the first, second and third signals 104, 106, 108 should be modified 118. The memory trainers 120a, 120b, 120c may execute a full training process, that may include rebooting the computing system. The memory trainers 120a, 120b, 120c may execute an iterative process with the memory controller 102 to modify electrical and/or timing characteristics of the first, second and third signals 104, 106, 108.

For example, the memory trainers 120a, 120b, 120c may test the first, second and third memory blocks 110, 112, 114 based on the first, second and third signals 104, 106, 108 to identify whether the first, second and third memory blocks 110, 112, 114 operate correctly based on commands and data communicated by the first, second and third signals 104, 106, 108. The memory trainers 120a, 120b, 120c may determine adjustments to electrical and/or timing characteristics of the first, second and third signals 104, 106, 108 so that the first, second and third memory blocks 110, 112, 114 accurately receive commands and data from the memory controller 102. The memory trainers 120a, 120b, 120c may provide the adjustments to the memory controller 102 that outputs modified first, second and third signals 104, 106, 108. The memory trainers 120a, 120b, 120c may then execute another testing process based on the adjusted first, second and third signals 104, 106, 108 and adjust the first, second and third signals 104, 106, 108 accordingly. For example, the memory trainers 120a, 120b, 120c may adjust a guard band, timing and/or values of the first, second and third signals 104, 106, 108.

Thus, some embodiments may leverage rank margin functionality in boot process firmware, and trigger a test (e.g., margin test) on a limited number of memory blocks 110, 112, 114 and signals 104, 106, 108 for reduced boot times and enhanced memory reliability. Thus, it may be possible to deliver trustable memory system, such as first-third memory blocks 110, 112, 114 in a fast boot mode (i.e., without signal training in every boot process) no matter what environmental changes the computing system undergoes. Further, some embodiments may implement a software-based solution without custom hardware designs to facilitate a lower cost.

In some embodiments, the first, second and third memory blocks 110, 112, 114 may be volatile memory, such as Dynamic Random-Access Memory (DRAM), Synchronous DRAM (SDRAM), Dual-Inline-Memory-Modules (DIMM), etc. In some embodiments the first, second and third memory blocks 110, 112, 114 may be non-volatile. Further, in some embodiments the first, second and third memory blocks 110, 112, 114 may be of different types from each other.

Figure 2:
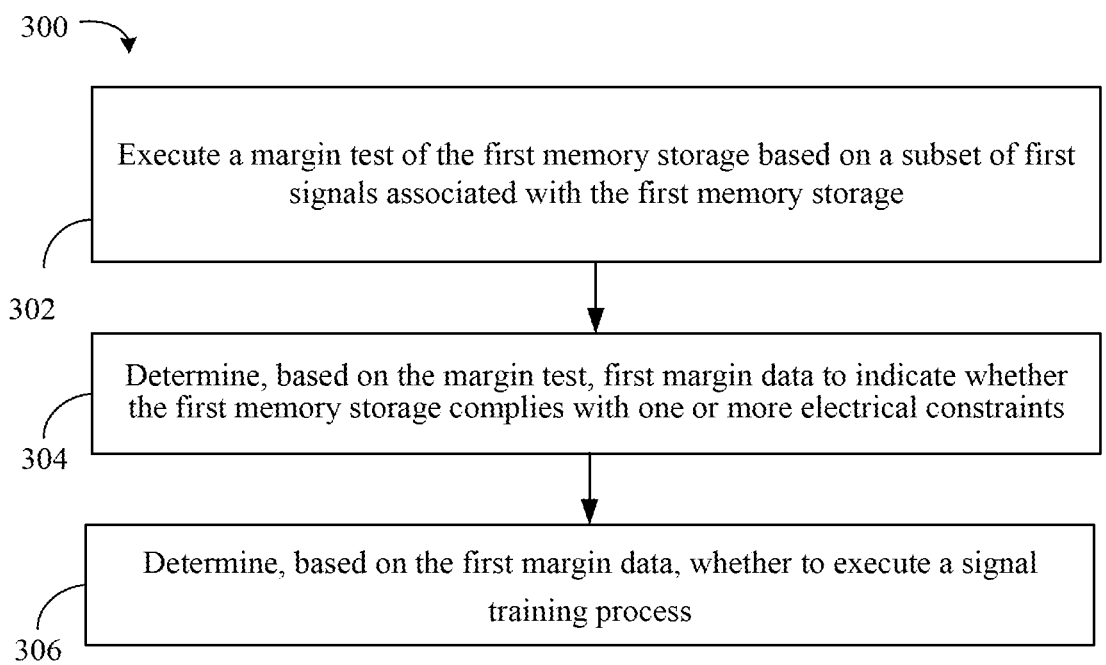
FIG. 2 is a flowchart of an example of a method of signal training according to an embodiment.

FIG. 2 shows a method 300 for signal training that may provide a low latency boot process, stable memory usage and stable operating environment. In an embodiment, the method 300 is implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 300 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 302 executes a margin test of the first memory storage based on a subset of first signals associated with the first memory storage. For example, the first signals are associated with a read of the first memory storage and a write to the first memory storage.

Illustrated processing block 304 determines, based on the margin test, first margin data to indicate whether the first memory storage complies with one or more electrical constraints. The one or more electrical constraints may be a proper voltage read by the first memory storage. For example, the one or more electrical constraints may be that the first memory storage should read a high voltage level when a memory controller outputs a corresponding a high voltage signal (i.e., the one or more subset signals). The one or more electrical constraints may not be met if the first memory storage reads a low voltage level when the memory controller outputs a high voltage signal.

Illustrated processing block 306 determines, based on the first margin data, whether to execute a signal training process. The signal training process includes adjusting one or more of an electrical characteristic or a timing characteristic (e.g., a timing, a voltage and/or a guard band) associated with at least one second signal that is different from the one or more subset signals. The at least one second signal is associated with a second memory storage that is different from the first memory storage.

In some embodiments, illustrated processing blocks 302, 304, 306 occur during a current boot process of a computing architecture. In some embodiments, the computing architecture includes the first and second memory storages. In some embodiments, illustrated processing block 306 includes determining whether to execute the signal training process based on a comparison of the first margin data to second margin data. If the first margin data is substantially different from the second margin data, processing block 306 determines that the signal training process is to be executed. The second margin data is determined during a previous boot sequence and based on another margin test. The second margin data indicates whether the first memory storage complies with the one or more electrical constraints during the previous boot sequence.

Figure 3:
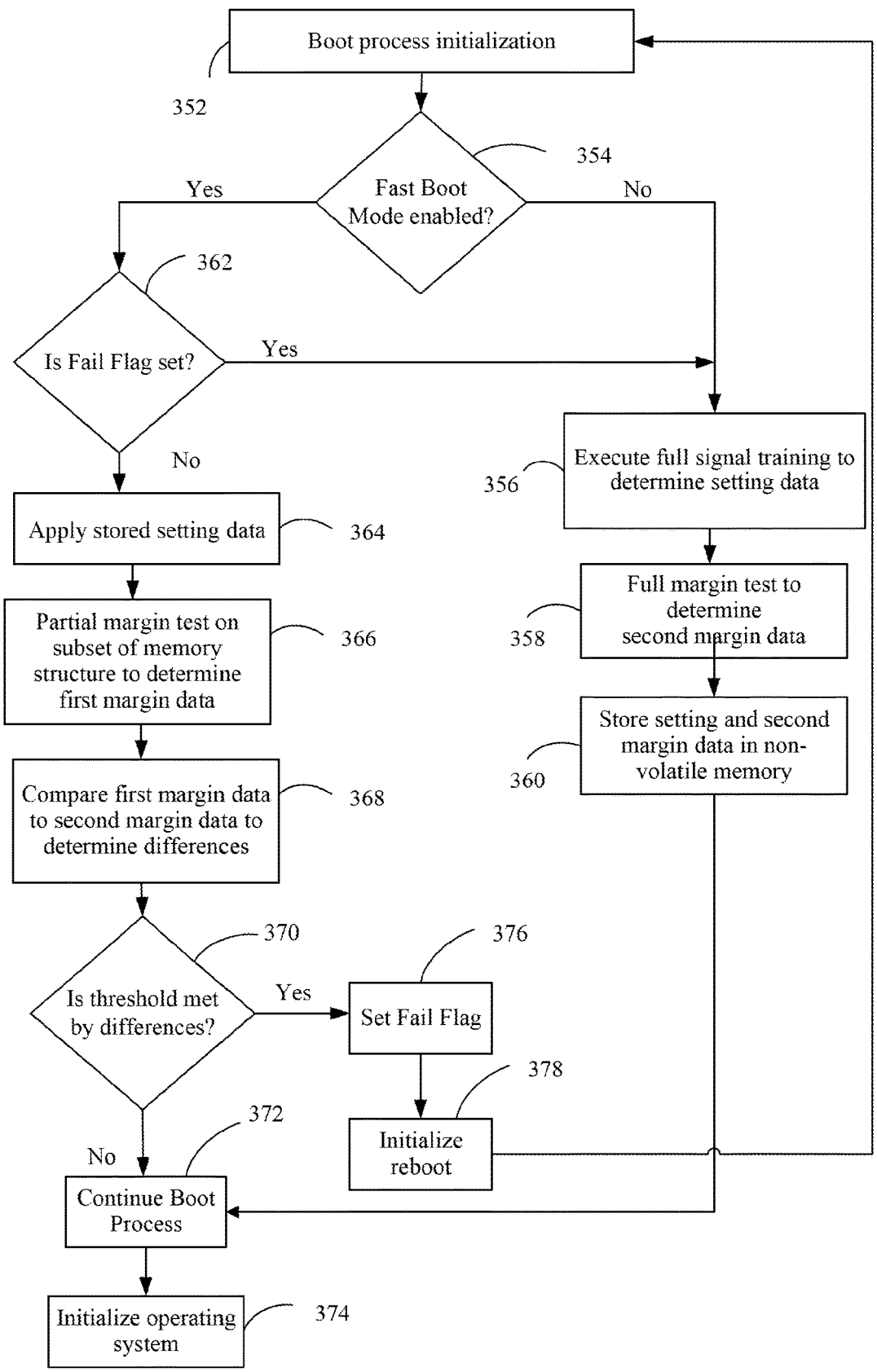
FIG. 3 is a flowchart of an example of a method of stable memory usage according to an embodiment.

FIG. 3 shows a method 350 illustrates a boot process flow to provide stable memory usage with enhanced signal training and memory management at low latency boot process speeds. More particularly, the method 350 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 352 includes boot process initialization of a computing system that includes memory storages and a memory controller. The memory controller may interact with the memory storages using memory signals. In some embodiments, a power button actuation or a software reboot command may trigger illustrated processing block 352.

Illustrated processing block 354 determines whether a "Fast Boot Mode" is enabled. A user may enable or disable the fast boot mode. When enabled, the fast boot mode may omit full memory signal training in some circumstances (explained below further). If the fast boot mode is disabled, illustrated processing block 356 executes a full signal training on the memory structure (e.g., memory storages and the memory signals) to determine setting data (e.g., timing and/or electrical values of the memory signals). For example, block 356 trains all control, command and data signals associated with the memory storages. Illustrated processing block 358 executes a full margin test on the entire memory structure to determine second margin data. Illustrated processing block executes the margin test over all ranks and signals (e.g., data, control, etc.). Illustrated processing block 360 stores the setting and second margin data in a non-volatile memory to be accessed after the boot process completes (e.g., future boot processes and/or while the operating system is executing). Illustrated processing block 360 then proceeds to illustrated processing block 372 to continue the boot process. Illustrated processing block 374 may initialize the operating system and utilize the setting data during execution of an operating system.

If illustrated processing block 354 determines that the fast boot mode is enabled, illustrated processing block 362 determines whether a fail flag is set. The fail flag indicates whether a previous margin test failed (explained below). If the fail flag is set, the method 350 proceeds to illustrated processing block 356 to execute full signal training, and then to processing block 358 to reset the fail flag. The fail flag indicates whether the computing system is undergoing a reboot due to a margin shift detected during a previous boot process (e.g., during a fast boot mode of a directly preceding boot process). Thus, method 350 delivers a trustable memory storage system architecture.

If the fail flag is not set, the method 350 proceeds to illustrated processing block 364. Illustrated processing block 364 applies stored setting data. The stored setting data was determined during a previous boot process of the computing system, for example at block 356 of the previous boot process. In particular, the setting data may include saved timings for the memory signals (e.g., when to send the memory signals relative to rising and falling edges of a clock of the computing architecture) and voltages.

Illustrated processing block 366 executes a partial margin test on the memory structure (e.g., a subset of the memory storages and a subset of the memory signals) to determine first margin data. In contrast, some RMT applications may test all memory storages and memory signals. Thus, illustrated processing block 366 executes with enhanced time and power efficiency. For example, processing block 366 may run the RMT on one or two ranks of a DIMM of the computing system, and on limited signals of the one or two ranks. For example, processing block 366 may only execute a command signals margin test on the one or two ranks, and not a data signal margin test or control signal margin test.

That is, the method 350 is to detect an impact of significant signal shift and correct the signal shift by re-training the memory signals, and as such there is no need to run a test on all signals of the memory storages or even all the signals of one memory storage. Rather, the identification of significant signal shift is identified from a subset of the memory signals (i.e., less than all memory signals) and a subset of the memory storages (i.e., less than all memory storages). A rank of a DIMM may include a set of dynamic random-access memory (DRAM) chips including a DRAM and one or more optional error correction code (ECC) modules. The number of DRAM chips and ECC modules may vary according to the different ranks.

Illustrated processing block 368 compares the first margin data to the second margin data. Processing block 368 checks for significant signal shifts, and so processing block 368 identifies a margin delta (i.e., differences) between a last cold boot with full memory training applied by block 356 and margin testing executed by block 358, and the current fast boot. Processing block 368 therefore determines differences between the first and second margin data.

As an example, processing block 368 determines from the second margin data, a second value for control signal(s) of one or two ranks. As described above, the second margin data was determined during a margin testing of a previous boot process. Processing block 368 determines from the first margin data, a first value for the control signal(s) of the one or two ranks. As described, the first margin data is determined during the margin test of a current boot process. Processing block 368 determines a difference between the first value and the second value. Likewise, other results of the margin tests stored in the first and second margin data are compared. As noted, the same setting data (e.g., timing data of signals) may be used when executing the margin tests to generate the first and second margin data.

Processing block 370 may determine whether a threshold is met by the differences. The threshold may be set by a user or be a predetermined value. In some embodiments, processing block 370 may determine if there is any significant change on a specific signal's margin, irrespective of whether a current signal margin is higher or lower than a previous signal margin. In some embodiments, if a pass/fail margin test methodology is employed, processing block 370 may compare the first and second margin data to determine whether enough of the passes and fails are changed between the second margin data and the first margin data, or between previous boot and current boot. If so, then processing block 376 may set the fail flag so that on during a reboot process, the full signal training of processing block 356 executes. Processing block 378 may initialize the reboot (i.e., reboot process) along with the memory re-training request (i.e., the fail flag is set).

If processing block 370 determines that the threshold is not met, the signals' quality may be deemed sufficient and illustrated processing block 372 performs a continuous boot process. Processing block 374 may initialize the operating system with the trustable memory storages.

Figure 4:
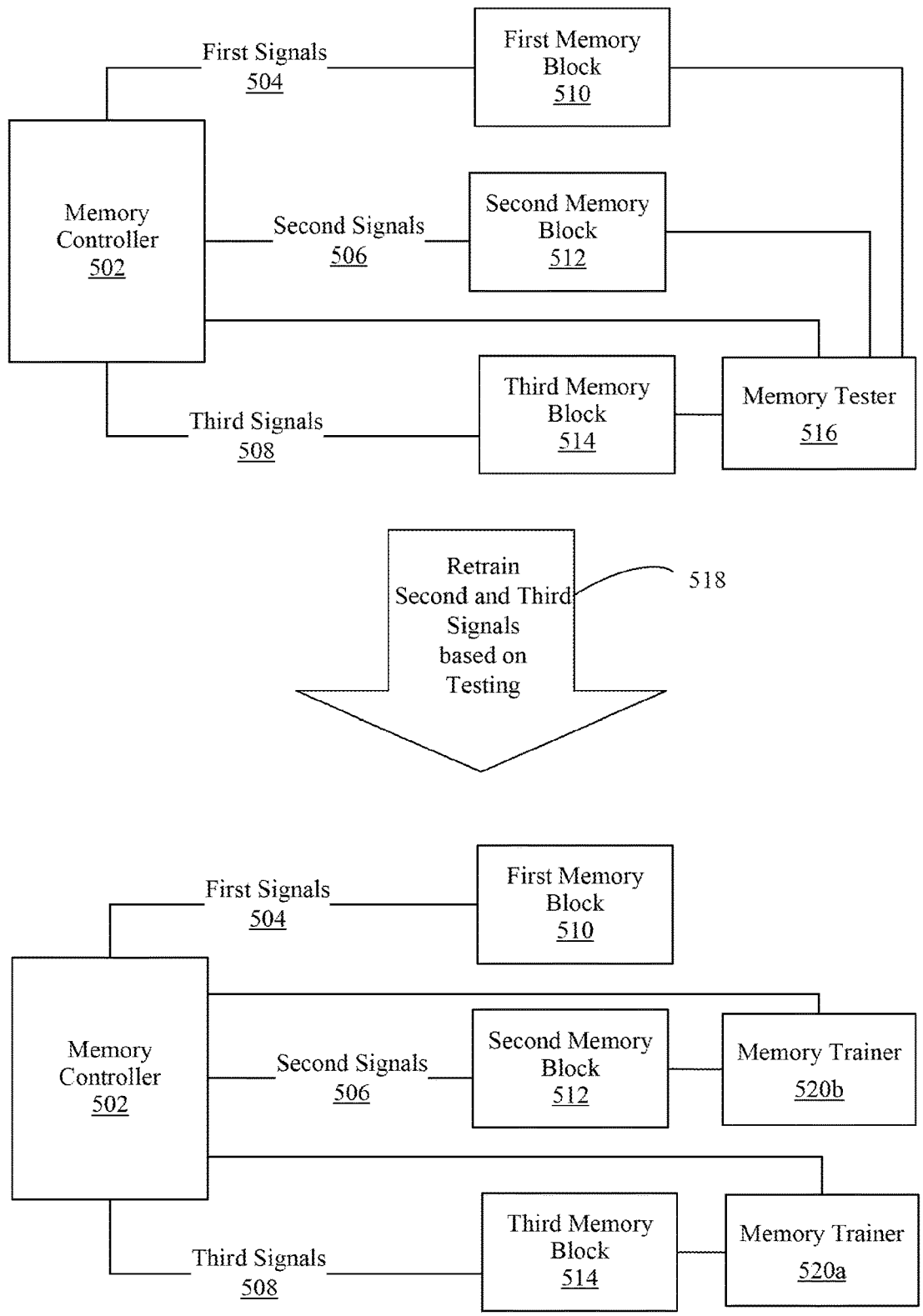
FIG. 4 illustrates an example of a process to retrain memory signals by testing memory blocks according to an embodiment.

FIG. 4 illustrates a process 500 to enhance memory usage while also maintaining low latency boot processes. The process 500 may include similar elements to process 100, and the corresponding description is omitted for brevity. In process 500, the memory tester 516 may test the first memory block 510 based on a first subset of the first signals 502. That is, not all of the first signals 504 are tested. The memory tester 516 may further test the second memory block 512 based on a second subset of the second signals 506. That is, not all of the second signals 506 are tested. The memory tester 516 may further test the third memory block 514 based on a third subset of the third signals 508. That is, not all of the third signals 508 are tested. In further detail, the memory tester 516 may not test all of the first, second and third signals 504, 506, 506, but may test each of the first, second and third memory blocks 510, 512, 514.

The process 500 may retrain the second and third signals 506, 508 based on the testing 518, and specifically the testing of the second and third memory blocks 510, 512 based on the second and third subsets. That is, process 500 may identify that the second and third signals 506, 508 may need to be retrained based on the second and third subsets and the second and third memory blocks 510, 512 failing to conform to electrical constraints. Therefore, the memory trainers 520a, 520b may be employed to retrain the second and third signals 506, 508.

As illustrated, the memory tester 516 may identify that the first memory block 510 and first signals 504 conform to the electrical constraints. Therefore, the first memory block 510 and first signals 504 are not retrained. As such, the process 500 may limit the testing to first, second and third subsets, and limit retraining to the second and third memory blocks 512, 514. Doing so may reduce the retraining time while also ensuring a stable memory environment, particularly if the first, second and third memory blocks 510, 512, 514 are of different types from each other. For example, different types of memory may respond differently to environmental changes. In the present example, the first memory block 510 may be of a first type of memory (e.g., static random-access memory or SRAM) and the second memory block 514 may be a different type of memory (e.g., erasable programmable read-only memory or EPROM), and thus have different testing outcomes. In another example, the first memory block 510 may be relatively younger than the second memory block 512, and hence have enhanced hardware to exhibit greater resilience to environmental changes.

Figure 5:
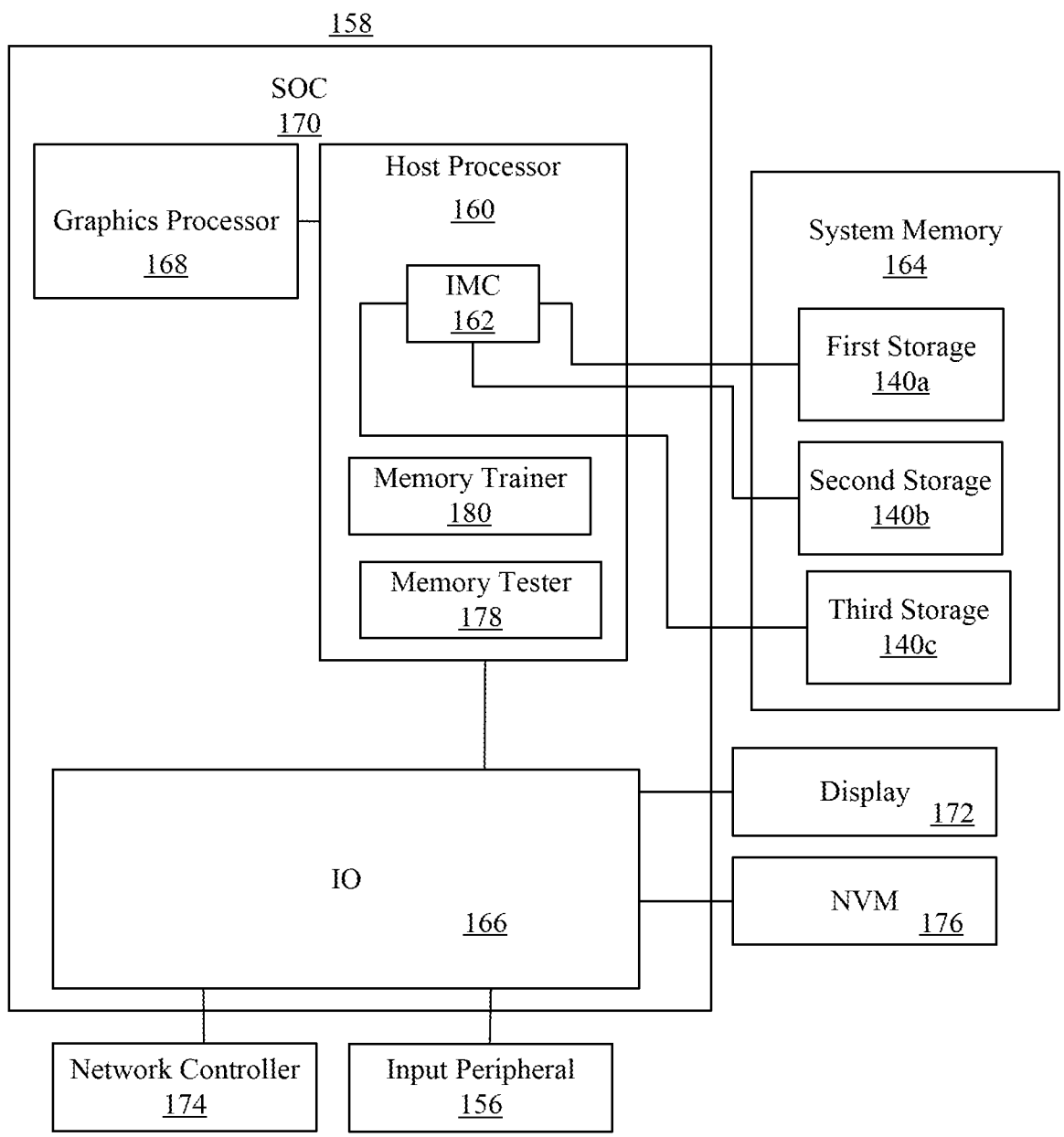
FIG. 5 is a block diagram of an example of a computing system according to an embodiment.

Turning now to FIG. 5, a stability enhanced computing system 158 (e.g., server, desktop, laptop, mobile device, etc.) is shown. The computing system 158 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), etc., or any combination thereof. In the illustrated example, the system 158 includes a host processor 160 (e.g., CPU with one or more processor cores) having an integrated memory controller (IMC) 162 that is coupled to a system memory 164, and particularly to first-third storages 140a-140c. The IMC 162 may communicate with the first-third storage 140a-140c to store and retrieve data. The first-third storages 140a-140c may be DRAM. The memory tester 178 may test, during a boot process of the system 158, one or more of the first-third storages 140a-140c based on a subset of signals used by the IMC 162 to communicate with the first-third storages 140a-140c. The test may determine whether the first-third storages 140a-140b are accurately receiving and interpreting signals from the IMC 162. If the test indicates not, the system 158 may reboot and the memory trainer 180 may retrain the signals to ensure a safe and reliable memory usage. Thus, the memory tester 178, the memory trainer 180 and the first-third storages 140a-140c may implement one or more aspects of the process 100 (FIG. 1), the method 300 (FIG. 2), method 350 (FIG. 3), and/or process 500 (FIG. 4) already discussed.

The illustrated system 158 also includes a graphics processor 168 (e.g., graphics processing unit/GPU) and an input output (IO) module 166 implemented together with the processor 160 (e.g., as microcontrollers) on a semiconductor die 170 as a System on Chip (SOC), where the IO module 166 may communicate with, for example, a display 172 (e.g., touch screen, liquid crystal display/LCD, light emitting diode/LED display), an input peripheral 156 (e.g., mouse, keyboard, microphone), a network controller 174 (e.g., wired and/or wireless), and mass storage 176 (e.g., hard disk drive/HDD, optical disc, solid-state drive/SSD, flash memory or other non-volatile memory/NVM).

Figure 6:
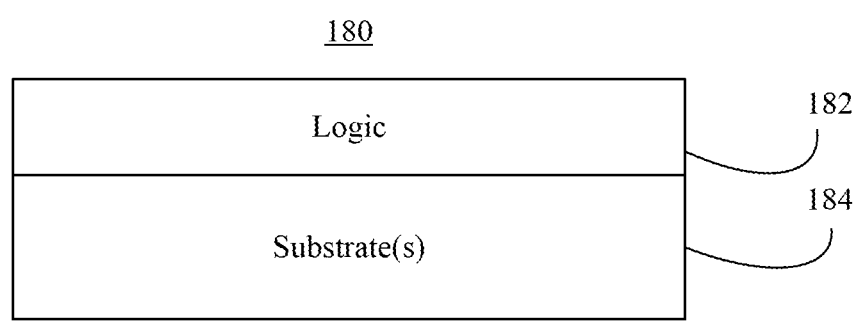
FIG. 6 is an illustration of an example of a semiconductor apparatus according to an embodiment.

FIG. 6 shows a semiconductor package apparatus 180. The illustrated apparatus 180 includes one or more substrates 184 (e.g., silicon, sapphire, gallium arsenide) and logic 182 (e.g., transistor array and other integrated circuit/IC components) coupled to the substrate(s) 184. In one example, the logic 182 is implemented at least partly in configurable logic or fixed-functionality logic hardware. The logic 182 may implement one or more aspects of the process 100 (FIG. 1), the method 300 (FIG. 2), method 350 (FIG. 3), and/or process 500 (FIG. 4) already discussed. In some embodiments, the logic 182 may execute a margin test of a first memory storage based on one or more subset signals of first signals that are to be received by the first memory storage during the margin test. The logic 182 may determine, based on the margin test, first margin data to indicate whether the first memory storage complies with one or more electrical constraints. The logic 182 may determine, based on the first margin data, whether to execute a signal training process. In one example, the logic 182 includes transistor channel regions that are positioned (e.g., embedded) within the substrate(s) 184. Thus, the interface between the logic 182 and the substrate(s) 184 may not be an abrupt junction. The logic 182 may also be considered to include an epitaxial layer that is grown on an initial wafer of the substrate(s) 184.

Figure 7:
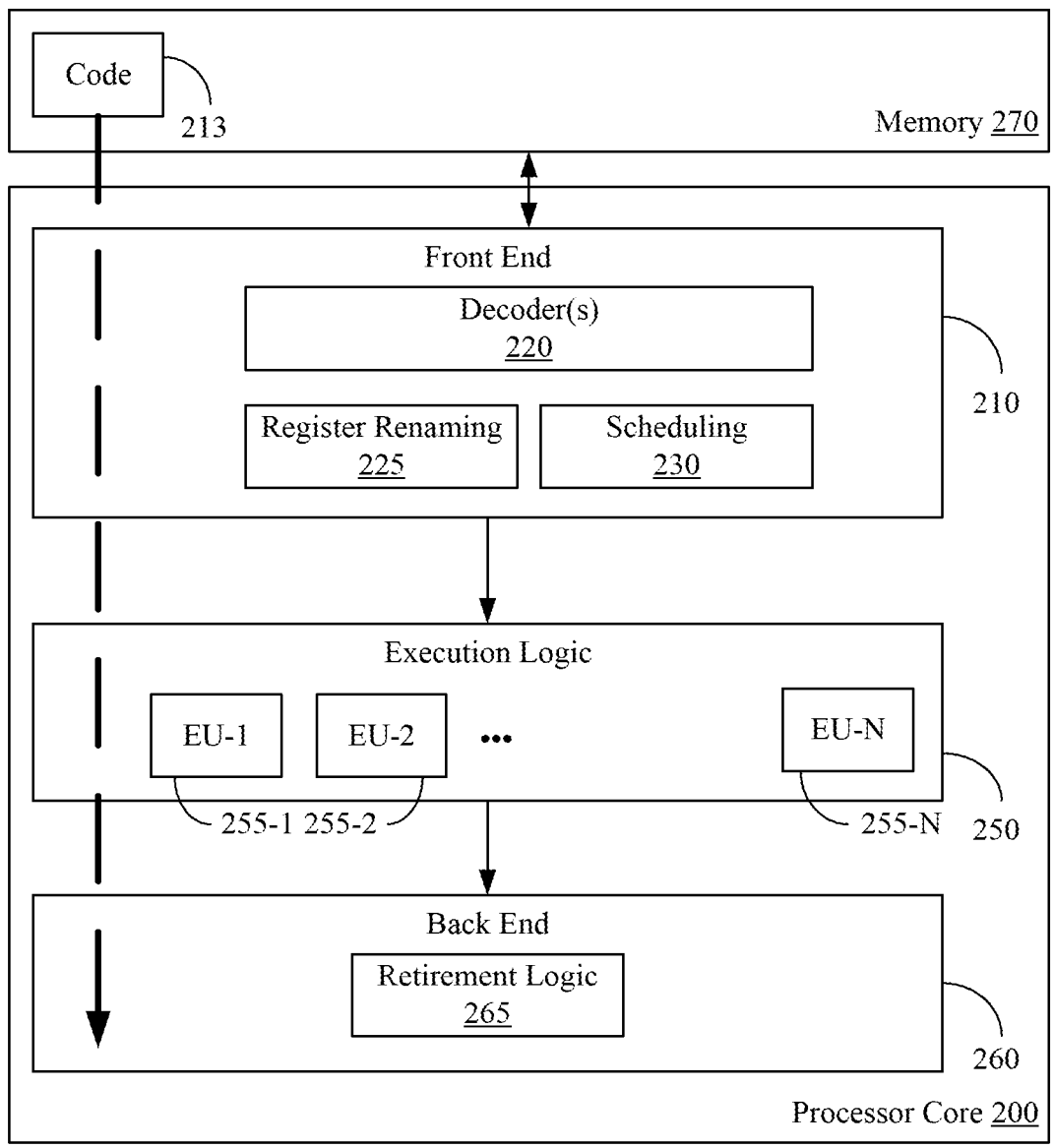
FIG. 7 is a block diagram of an example of a processor according to an embodiment.

FIG. 7 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 7, a processing element may alternatively include more than one of the processor core 200 illustrated in FIG. 7. The processor core 200 may be a single-threaded core or, for at least one embodiment, the processor core 200 may be multithreaded in that it may include more than one hardware thread context (or "logical processor") per core.

FIG. 7 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the process 100 (FIG. 1), the method 300 (FIG. 2), method 350 (FIG. 3), and/or process 500 (FIG. 4) already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 7, a processing element may include other elements on chip with the processor core 200. For example, a processing element may include memory control logic along with the processor core 200. The processing element may include input/output (I/O) control logic and/or may include I/O control logic integrated with memory control logic. The processing element may also include one or more caches.

Figure 8:
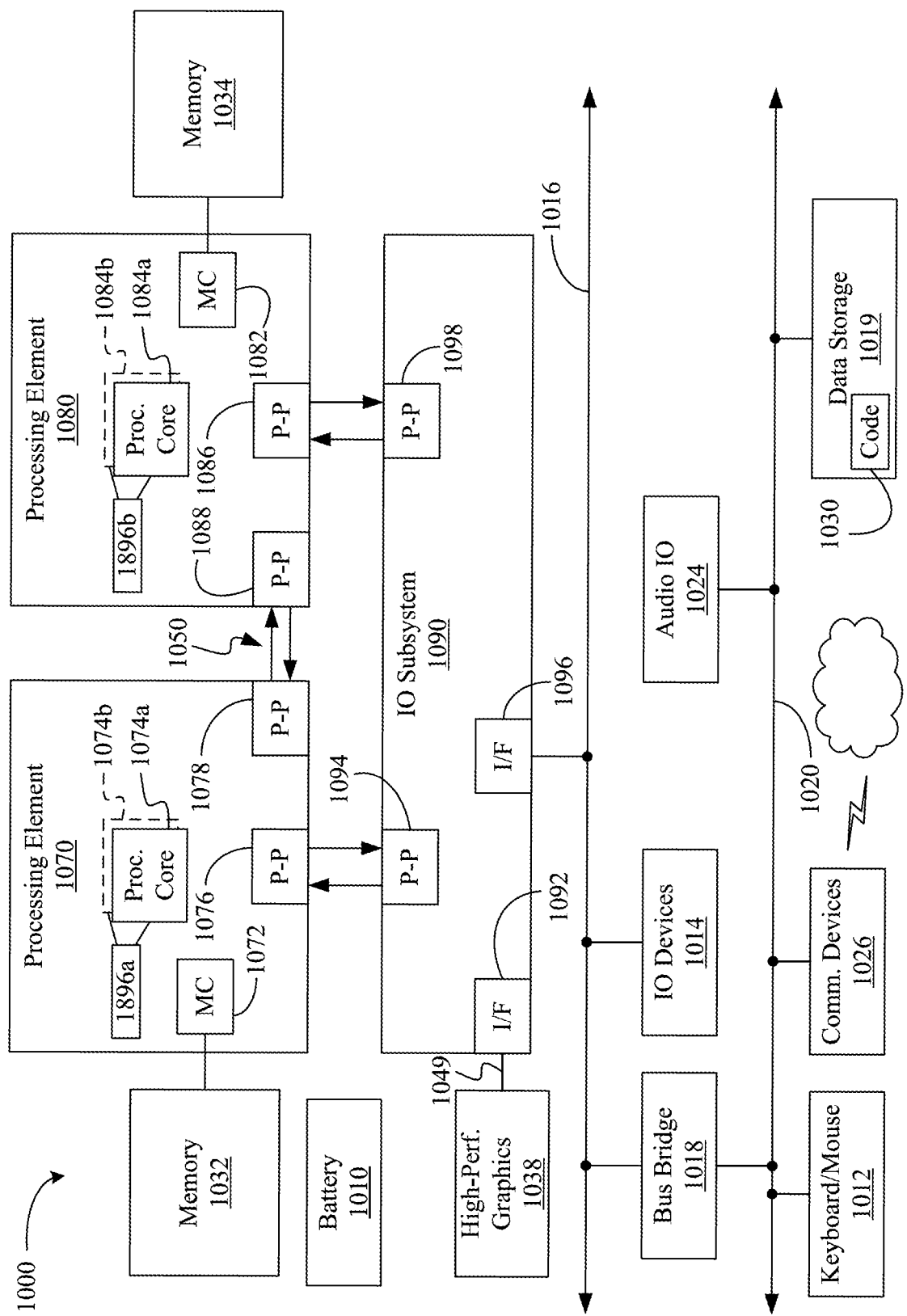
FIG. 8 is a block diagram of an example of a multi-processor based computing system according to an embodiment.

Referring now to FIG. 8, shown is a block diagram of a computing system 1000 embodiment in accordance with an embodiment. Shown in FIG. 8 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 8 may be implemented as a multi-drop bus rather than point-to-point interconnect.

As shown in FIG. 8, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 7.

Each processing element 1070, 1080 may include at least one shared cache 1896a, 1896b. The shared cache 1896a, 1896b may store data (e.g., instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 12, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 10, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments are not so limited.

As shown in FIG. 8, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive or other mass storage device which may include code 1030, in one embodiment. The illustrated code 1030 may implement one or more aspects of the process 100 (FIG. 1), the method 300 (FIG. 2), method 350 (FIG. 3), and/or process 500 (FIG. 4) already discussed. Further, an audio I/O 1024 may be coupled to second bus 1020 and a battery 1010 may supply power to the computing system 1000.

Note that other embodiments are contemplated. For example, instead of the point-to-point architecture of FIG. 8 a system may implement a multi-drop bus or another such communication topology. Also, the elements of FIG. 8 may alternatively be partitioned using more or fewer integrated chips than shown in FIG. 8.

ADDITIONAL NOTES AND EXAMPLES

Example 1 includes a computing device including a host processor, and a plurality of memory storages coupled to the host processor and including a first memory storage, the plurality of memory storages including executable program instructions, which when executed by the host processor, cause the host processor to execute a margin test of the first memory storage based on a subset of first signals associated with the first memory storage, determine, based on the margin test, first margin data to indicate whether the first memory storage complies with one or more electrical constraints, and determine, based on the first margin data, whether to execute a signal training process.

Example 2 includes the computing device of example 1, wherein the executable program instructions, which when executed by the host processor, is to cause the host processor to execute the margin test, determine the first margin data and whether to execute the signal training process during a current boot process of the computing device.

Example 3 includes the computing device of example 2, wherein the executable program instructions, which when executed by the host processor, cause the host processor to during a previous boot sequence of the computing device, execute another margin test on the first memory storage, during the previous boot sequence and based on the another margin test, determine second margin data to indicate whether the first memory storage complies with the one or more electrical constraints, and determine whether to execute the signal training process based on a comparison of the first margin data to the second margin data Example 4 includes the computing device of example 1, wherein the first signals are associated with a read of the first memory storage and a write to the first memory storage.

Example 5 includes the computing device of example 4, wherein the executable program instructions, which when executed by the host processor, cause the host processor to determine, based on the first margin data, that the signal training process is to be executed, execute a reboot process of the computing device, and execute, during the reboot process, the signal training process to adjust one or more of an electrical characteristic or a timing characteristic associated with at least one second signal that is different from the subset of the first signals.

Example 6 includes the computing device of example 5, wherein the at least one second signal is associated with a second memory storage of the plurality of memory storages.

Example 7 includes a semiconductor apparatus including one or more substrates, and logic coupled to the one or more substrates, wherein the logic is implemented in one or more of configurable logic or fixed-functionality logic hardware, the logic coupled to the one or more substrates to execute a margin test of a first memory storage based on a subset of first signals associated with the first memory storage, determine, based on the margin test, first margin data to indicate whether the first memory storage complies with one or more electrical constraints, and determine, based on the first margin data, whether to execute a signal training process.

Example 8 includes the semiconductor apparatus of example 7, wherein the logic is to execute the margin test, determine the first margin data and determine whether to execute the signal training process during a current boot process of a computing device, and the computing device includes the first memory storage.

Example 9 includes the semiconductor apparatus of example 8, wherein the logic coupled to the one or more substrates is to during a previous boot sequence, execute another margin test on the first memory storage, during the previous boot sequence and based on the another margin test, determine second margin data to indicate whether the first memory storage complies with the one or more electrical constraints, and determine whether to execute the signal training process based on a comparison of the first margin data to the second margin data.

Example 10 includes the semiconductor apparatus of example 7, the first signals are associated with a read of the first memory storage and a write to the first memory storage.

Example 11 includes the semiconductor apparatus of example 7, wherein the logic coupled to the one or more substrates is to determine, based on the first margin data, that the signal training process is to be executed, execute a reboot process of a computing device that includes the first memory storage, and execute, during the reboot process, the signal training process to adjust one or more of an electrical characteristic or a timing characteristic associated with at least one second signal that is different from the subset of the first signals.

Example 12 includes the semiconductor apparatus of example 11, wherein the at least one second signal is associated with a second memory storage different from the first memory storage.

Example 13 includes the semiconductor apparatus of example 7, wherein the logic coupled to the one or more substrates includes transistor channel regions that are positioned within the one or more substrates.

Example 14 includes at least one computer readable storage medium including a set of executable program instructions, which when executed by a computing system, cause the computing system to execute a margin test of a first memory storage based on a subset of first signals associated with the first memory storage, determine, based on the margin test, first margin data to indicate whether the first memory storage complies with one or more electrical constraints, and determine, based on the first margin data, whether to execute a signal training process.

Example 15 includes the at least one computer readable storage medium of example 14, wherein the executable program instructions, when executed by the computing system, cause the computing system to execute the margin test, determine the first margin data and determine whether to execute the signal training process during a current boot process of the computing system, and the computing system includes the first memory storage.

Example 16 includes the at least one computer readable storage medium of example 15, wherein the executable program instructions, when executed by the computing system, cause the computing system to during a previous boot sequence of the computing system, execute another margin test on the first memory storage, during the previous boot sequence and based on the another margin test, determine second margin data to indicate whether the first memory storage complies with the one or more electrical constraints, and determine whether to execute the signal training process based on a comparison of the first margin data to the second margin data.

Example 17 includes the at least one computer readable storage medium of example 14, wherein the first signals are associated with a read of the first memory storage and a write to the first memory storage.

Example 18 includes the at least one computer readable storage medium of example 14, wherein the executable program instructions, when executed by the computing system, cause the computing system to determine, based on the first margin data, that the signal training process is to be executed, execute a reboot process of the computing system, wherein the computing system includes the first memory storage, and execute, during the reboot process, the signal training process to adjust one or more of an electrical characteristic or a timing characteristic associated with at least one second signal that is different from the subset of the first signals.

Example 19 includes the at least one computer readable storage medium of example 18, wherein the at least one second signal is associated with a second memory storage different from the first memory storage.

Example 20 includes a method including executing a margin test of a first memory storage based on a subset of first signals associated with the first memory storage, determining, based on the margin test, first margin data indicating whether the first memory storage complies with one or more electrical constraints, and determining whether to execute a signal training process based on the first margin data.

Example 21 includes the method of example 20, wherein the executing, the determining the first margin data, and the determining whether to execute the signal training process occurs during a current boot process of a computing device, and the computing device includes the first memory storage.

Example 22 includes the method of example 21, further including during a previous boot sequence, executing another margin testing of the first memory storage, during the previous boot sequence and based on the another margin testing, determining second margin data indicating whether the first memory storage complies with the one or more electrical constraints, and determining whether to execute the signal training process based on a comparison of the first margin data to the second margin data.

Example 23 includes the method of example 20, wherein the first signals are associated with a read of the first memory storage and a write to the first memory storage.

Example 24 includes the method of example 20, further including determining, based on the first margin data, that the signal training process is to be executed, rebooting a computing device that includes the first memory storage, and executing, during the rebooting, the signal training process to adjust one or more of an electrical characteristic or a timing characteristic associated with at least one second signal that is different from the subset of the first signals.

Example 25 includes the method of example 24, further wherein the at least one second signal is associated with a second memory storage different from the first memory storage.

Example 26 includes a semiconductor apparatus including a means for executing a margin test of a first memory storage based on a subset of first signals associated with the first memory storage, means for determining, based on the margin test, first margin data indicating whether the first memory storage complies with one or more electrical constraints, and means for determining whether to execute a signal training process based on the first margin data.

Example 27 includes the semiconductor apparatus of example 26, wherein the means for executing, the means for determining the first margin data, and the means for determining whether to execute the signal training process execute during a current boot process of a computing device, and the computing device includes the first memory storage.

Example 28 includes the semiconductor apparatus of example 27, further including means for during a previous boot sequence, executing another margin testing of the first memory storage, means for during the previous boot sequence and based on the another margin testing, determining second margin data indicating whether the first memory storage complies with the one or more electrical constraints, and means for determining whether to execute the signal training process based on a comparison of the first margin data to the second margin data.

Example 29 includes the semiconductor apparatus of example 26, wherein the first signals are associated with a read of the first memory storage and a write to the first memory storage.

Example 30 includes the semiconductor apparatus of example 26, further including means for determining, based on the first margin data, that the signal training process is to be executed, means for rebooting a computing device that includes the first memory storage and means for executing, during the rebooting, the signal training process to adjust one or more of an electrical characteristic or a timing characteristic associated with at least one second signal that is different from the subset of the first signals.

Example 31 includes the semiconductor apparatus of example 30, further wherein the at least one second signal is associated with a second memory storage different from the first memory storage.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the computing system within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing device comprising:
   a host processor; and
   a plurality of memory storages coupled to the host processor and including a first memory storage, the plurality of memory storages including executable program instructions, which when executed by the host processor, cause the host processor to:
   execute a margin test of the first memory storage based on a subset of first signals associated with the first memory storage;
   determine, based on the margin test, first margin data to indicate whether the first memory storage complies with one or more electrical constraints; and
   determine, based on the first margin data, whether to execute a signal training process to retrain a plurality of signals associated with the plurality of memory storages.

2. The computing device of claim 1, wherein the executable program instructions, which when executed by the host processor, is to cause the host processor to execute the margin test, determine the first margin data and whether to execute the signal training process during a current boot process of the computing device.

3. The computing device of claim 2, wherein the executable program instructions, which when executed by the host processor, cause the host processor to:
   during a previous boot sequence of the computing device, execute another margin test on the first memory storage;
   during the previous boot sequence and based on the another margin test, determine second margin data to indicate whether the first memory storage complies with the one or more electrical constraints; and
   determine whether to execute the signal training process based on a comparison of the first margin data to the second margin data.

4. The computing device of claim 1, wherein the first signals are associated with a read of the first memory storage and a write to the first memory storage, wherein the plurality of signals includes the first signals.

5. The computing device of claim 1, wherein the executable program instructions, which when executed by the host processor, cause the host processor to:

determine, based on the first margin data, that the signal training process is to be executed;
execute a reboot process of the computing device; and
execute, during the reboot process, the signal training process to adjust one or more of an electrical characteristic or a timing characteristic associated with at least one second signal that is different from the subset of the first signals, wherein the plurality of signals includes the first signals and the at least one second signal.

6. The computing device of claim 5, wherein the at least one second signal is associated with a second memory storage of the plurality of memory storages.

7. A semiconductor apparatus comprising:
one or more substrates; and
logic coupled to the one or more substrates, wherein the logic is implemented in one or more of configurable logic or fixed-functionality logic hardware, the logic coupled to the one or more substrates to:
execute a margin test of a first memory storage based on a subset of first signals associated with the first memory storage;
determine, based on the margin test, first margin data to indicate whether the first memory storage complies with one or more electrical constraints; and
determine, based on the first margin data, whether to execute a signal training process to retrain a plurality of signals associated with a plurality of memory storages, wherein the plurality of memory storages includes the first memory storage.

8. The semiconductor apparatus of claim 7, wherein:
the logic is to execute the margin test, determine the first margin data and determine whether to execute the signal training process during a current boot process of a computing device; and
the computing device includes the plurality of memory storages.

9. The semiconductor apparatus of claim 8, wherein the logic coupled to the one or more substrates is to:
during a previous boot sequence, execute another margin test on the first memory storage;
during the previous boot sequence and based on the another margin test, determine second margin data to indicate whether the first memory storage complies with the one or more electrical constraints; and
determine whether to execute the signal training process based on a comparison of the first margin data to the second margin data.

10. The semiconductor apparatus of claim 7, wherein the first signals are associated with a read of the first memory storage and a write to the first memory storage, wherein the plurality of signals includes the first signals.

11. The semiconductor apparatus of claim 7, wherein the logic coupled to the one or more substrates is to:
determine, based on the first margin data, that the signal training process is to be executed;
execute a reboot process of a computing device that includes the plurality of memory storages; and
execute, during the reboot process, the signal training process to adjust one or more of an electrical characteristic or a timing characteristic associated with at least one second signal that is different from the subset of the first signals, wherein the plurality of signals includes the first signals and the at least one second signal.

12. The semiconductor apparatus of claim 11, wherein the at least one second signal is associated with a second memory storage of the plurality of memory storages different from the first memory storage.

13. The semiconductor apparatus of claim 7, wherein the logic coupled to the one or more substrates includes transistor channel regions that are positioned within the one or more substrates.

14. At least one non-transitory computer readable storage medium comprising a set of executable program instructions, which when executed by a computing system, cause the computing system to:
execute a margin test of a first memory storage based on a subset of first signals associated with the first memory storage;
determine, based on the margin test, first margin data to indicate whether the first memory storage complies with one or more electrical constraints; and
determine, based on the first margin data, whether to execute a signal training process to retrain a plurality of signals associated with a plurality of memory storages, wherein the plurality of memory storages includes the first memory storage.

15. The at least one non-transitory computer readable storage medium of claim 14, wherein:
the executable program instructions, when executed by the computing system, cause the computing system to execute the margin test, determine the first margin data and determine whether to execute the signal training process during a current boot process of the computing system; and
the computing system includes the plurality of memory storages.

16. The at least one non-transitory computer readable storage medium of claim 15, wherein the executable program instructions, when executed by the computing system, cause the computing system to:
during a previous boot sequence of the computing system, execute another margin test on the first memory storage;
during the previous boot sequence and based on the another margin test, determine second margin data to indicate whether the first memory storage complies with the one or more electrical constraints; and
determine whether to execute the signal training process based on a comparison of the first margin data to the second margin data.

17. The at least one non-transitory computer readable storage medium of claim 14, wherein the first signals are associated with a read of the first memory storage and a write to the first memory storage, wherein the plurality of signals includes the first signals.

18. The at least one non-transitory computer readable storage medium of claim 14, wherein the executable program instructions, when executed by the computing system, cause the computing system to:
determine, based on the first margin data, that the signal training process is to be executed;
execute a reboot process of the computing system, wherein the computing system includes the plurality of memory storages; and
execute, during the reboot process, the signal training process to adjust one or more of an electrical characteristic or a timing characteristic associated with at least one second signal that is different from the subset of the first signals, wherein the plurality of signals includes the first signals and the at least one second signal.

19. The at least one non-transitory computer readable storage medium of claim 18, wherein the executable program instructions, wherein the at least one second signal is associated with a second memory storage of the plurality of memory storages different from the first memory storage.

20. A method comprising:
executing a margin test of a first memory storage based on a subset of first signals associated with the first memory storage;
determining, based on the margin test, first margin data indicating whether the first memory storage complies with one or more electrical constraints; and
determining whether to execute a signal training process based on the first margin data to retrain a plurality of signals associated with a plurality of memory storages, wherein the plurality of memory storages includes the first memory storage.

21. The method of claim 20, further comprising:
executing the margin test, determining the first margin data and whether to execute the signal training process during a current boot process of a computing device, wherein the computing device includes the plurality of memory storages.

22. The method of claim 21, further comprising:
during a previous boot sequence of a computing device, executing another margin test on the first memory storage;
during the previous boot sequence and based on the another margin test, determining second margin data to indicate whether the first memory storage complies with the one or more electrical constraints; and
determining whether to execute the signal training process based on a comparison of the first margin data to the second margin data.

23. The method of claim 20, wherein the first signals are associated with a read of the first memory storage and a write to the first memory storage, wherein the plurality of signals includes the first signals.

24. The method of claim 20, further comprising:
determining, based on the first margin data, that the signal training process is to be executed;
executing a reboot process of a computing device, wherein the computing device includes the plurality of memory storages; and
executing, during the reboot process, the signal training process to adjust one or more of an electrical characteristic or a timing characteristic associated with at least one second signal that is different from the subset of the first signals, wherein the plurality of signals includes the first signals and the at least one second signal.

* * * * *